United States Patent
Shieh et al.

(10) Patent No.: US 7,974,368 B2
(45) Date of Patent: Jul. 5, 2011

(54) DECODING METHOD AND SYSTEM FOR REAL-TIME WIRELESS CHANNEL ESTIMATION

(75) Inventors: Shin-Lin Shieh, Jinhu Township, Kinmen County (TW); Po-Ning Chen, Hsinchu (TW); Yung-Hsiang Han, Taipei (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 900 days.

(21) Appl. No.: 11/902,549

(22) Filed: Sep. 24, 2007

(65) Prior Publication Data

US 2008/0075204 A1    Mar. 27, 2008

(30) Foreign Application Priority Data

Sep. 25, 2006 (TW) .............................. 95135411 A

(51) Int. Cl.
*H04L 27/06* (2006.01)
*H03K 9/00* (2006.01)

(52) U.S. Cl. ........................................ 375/341; 375/316

(58) Field of Classification Search .................. 375/341, 375/340, 316

See application file for complete search history.

(56) References Cited

U.S. PATENT DOCUMENTS

6,393,257 B1    5/2002    Holtzman ..................... 455/67.3

FOREIGN PATENT DOCUMENTS

WO    WO 2005062473 A1 *    7/2005

OTHER PUBLICATIONS

Mohammad Ali Khalighi, "Effect of Mismatched SNR on the Performance of Log-MAP Turbo Detector," *IEEE*, vol. 52, No. 5, pp. 1386-1397, Sep. 2003.

* cited by examiner

*Primary Examiner* — David C. Payne
*Assistant Examiner* — Brian J Stevens
(74) *Attorney, Agent, or Firm* — Bacon & Thomas, PLLC

(57) ABSTRACT

A decoding method and system for real-time wireless channel estimation, which decodes a received signal with a noise. The received signal is coded by a concatenation code. At first, the received signal is performed a certain amount of decoding by a Max-Log-MAP decoding procedure. Next, an estimated amplitude of the received signal and an estimated variance of a noise are computed. Then, the received signal is adjusted in accordance with the estimated amplitude and the estimated variance to thereby produce an adjusted received signal. Finally, the adjusted received signal is decoded by a Log-Map decoding procedure.

17 Claims, 7 Drawing Sheets

| Code Rate | SNR | Iteration (s) | Weighted Extrinsic | | Weighted LLR | | Amplitude (simulated) | | Remarks |
|---|---|---|---|---|---|---|---|---|---|
| | | | mean | var | mean | var | mean | var | |
| 1/3 | 0.3dB | 0.0 | | | 1.000 | 1.401 | 1.264 | 0.807 | W |
| | | 0.5 | 0.610 | 1.728 | 1.611 | 3.125 | 1.079 | 0.993 | $\hat{A}_{S=0.5}$ |
| | | 1.0 | 0.847 | 2.557 | 2.458 | 5.668 | 0.994 | 1.345 | $\hat{A}_{S=1.0}$ |
| | | 1.5 | 0.924 | 2.844 | 2.772 | 6.778 | 0.977 | 1.809 | $\hat{A}_{S=1.5}$ |
| | | 2.0 | 0.952 | 2.960 | 2.876 | 7.181 | 0.972 | 1.946 | $\hat{A}_{S=2.0}$ |
| | | 2.5 | 0.957 | 2.987 | 2.910 | 7.324 | 0.971 | 2.053 | $\hat{A}_{S=2.5}$ |
| | | 3.0 | 0.960 | 3.000 | 2.918 | 7.363 | 0.969 | 2.068 | $\hat{A}_{S=3.0}$ |
| | 0.5dB | 0.0 | | | 1.000 | 1.338 | 1.249 | 0.781 | W |
| | | 0.5 | 0.671 | 1.752 | 1.670 | 3.088 | 1.069 | 1.079 | $\hat{A}_{S=0.5}$ |
| | | 1.0 | 1.002 | 2.711 | 2.672 | 5.788 | 0.993 | 1.481 | $\hat{A}_{S=1.0}$ |
| | | 1.5 | 1.178 | 3.183 | 3.179 | 7.205 | 0.980 | 1.839 | $\hat{A}_{S=1.5}$ |
| | | 2.0 | 1.301 | 3.466 | 3.478 | 7.951 | 0.978 | 2.046 | $\hat{A}_{S=2.0}$ |
| | | 2.5 | 1.410 | 3.668 | 3.710 | 8.432 | 0.978 | 2.202 | $\hat{A}_{S=2.5}$ |
| | | 3.0 | 1.531 | 3.874 | 3.940 | 8.843 | 0.979 | 2.345 | $\hat{A}_{S=3.0}$ |

FIG. 7-1

| Code Rate | SNR | Iteration (s) | Weighted Extrinsic | | Weighted LLR | | Amplitude (simulated) | | Remarks |
|---|---|---|---|---|---|---|---|---|---|
| | | | mean | var | mean | var | mean | var | |
| 3/5 | 1.4dB | 0.0 | | | 1.000 | 0.604 | 1.073 | 0.454 | W |
| | | 0.5 | 0.289 | 0.327 | 1.289 | 0.932 | 1.029 | 0.496 | $\hat{A}_{S=0.5}$ |
| | | 1.0 | 0.411 | 0.481 | 1.700 | 1.411 | 1.001 | 0.625 | $\hat{A}_{S=1.0}$ |
| | | 1.5 | 0.467 | 0.548 | 1.879 | 1.631 | 0.993 | 0.748 | $\hat{A}_{S=1.5}$ |
| | | 2.0 | 0.501 | 0.583 | 1.968 | 1.731 | 0.972 | 1.946 | $\hat{A}_{S=2.0}$ |
| | | 2.5 | 0.252 | 0.603 | 2.265 | 1.785 | 0.992 | 0.783 | $\hat{A}_{S=2.5}$ |
| | | 3.0 | 0.552 | 0.619 | 2.077 | 1.818 | 0.992 | 0.832 | $\hat{A}_{S=3.0}$ |
| | 1.6dB | 0.0 | | | 1.000 | 0.577 | 1.067 | 0.439 | W |
| | | 0.5 | 0.331 | 0.338 | 1.331 | 0.916 | 1.025 | 0.451 | $\hat{A}_{S=0.5}$ |
| | | 1.0 | 0.513 | 0.527 | 1.844 | 1.440 | 1.000 | 0.569 | $\hat{A}_{S=1.0}$ |
| | | 1.5 | 0.642 | 0.638 | 2.155 | 1.737 | 0.995 | 0.639 | $\hat{A}_{S=1.5}$ |
| | | 2.0 | 0.764 | 0.724 | 2.406 | 1.932 | 0.995 | 0.667 | $\hat{A}_{S=2.0}$ |
| | | 2.5 | 0.902 | 0.801 | 2.667 | 2.092 | 0.995 | 0.726 | $\hat{A}_{S=2.5}$ |
| | | 3.0 | 1.083 | 0.880 | 2.986 | 2.243 | 0.996 | 0.776 | $\hat{A}_{S=3.0}$ |

FIG. 7-2

DECODING METHOD AND SYSTEM FOR REAL-TIME WIRELESS CHANNEL ESTIMATION

BACKGROUND OF THE INVENTION

1. Field of the Invention

The present invention relates to the technical field of error correcting codes (ECCs) and, more particularly, to a decoding method and system for real-time wireless channel estimation.

2. Description of Related Art

While a digital communication system transfers data, a receiving end may receive error messages because of non-predictable interferences or noises. Therefore, a channel coding is used to effectively reduce the bit error rate, without raising the transmission power, which typically occupies partial bandwidth for transmission but ensures that the bit error rate is controlled in an acceptable range. In recent years, the data transmission is required day by day. For a future data transmission, the coverage becomes wider and the transmission rate becomes faster. Accordingly, the channel coding is considered as an important part in a wireless transmission system design.

Turbo codes are an essential breakthrough in the recent channel coding, which can provide the superior error correcting capability and almost the ideal Shannon limit in transmission. Accordingly, the turbo codes are largely used in the field of wireless transmission, including satellite communications, digital image transmissions and 3GPPs.

FIG. 1 is a diagram of a typical configuration of communication system using a turbo code based on the UMTS WCDMA standard. As shown in FIG. 1, the communication system includes a turbo encoder 110, a modulator 120, a demodulator 130 and a turbo decoder 140. The turbo encoder 110 is given by an example of code rate ⅓ with 8-state turbo encoder. FIG. 2 is a block diagram of an embodiment of the turbo encoder 110. As shown in FIG. 2, the turbo encoder 110 includes an interleaver 210, a first encoder 220 and a second encoder 230. The turbo encoder 110 receives an information sequence μ, and produces a codeword c by a turbo coding. The codeword c includes systematic bits μ, first parity bits p produced by the first encoder 220, and second parity bits q produced by the second encoder 230; i.e., the codeword c={μ, p, q}.

The modulator 120 performs a BPSK modulation on the codeword c={μ,p,q} to thereby produce a modulated signal x, where $x \in \{+1,-1\}$. The modulated signal x is passed through an AWGN channel for transmission. The demodulator 130 receives the modulated signal x through the AWGN channel and demodulates it to thereby produce a received signal y expressed by $y_i = x_i + n = \pm 1 + n$, for n denotes noises in the AWGN channel and contains zero mean and variance $\sigma^2$.

FIG. 3 is a block diagram of the turbo decoder 140. As shown in FIG. 3, the turbo decoder 140 includes a first decoder 310, an interleaver 320, a second decoder 330, and a deinterleaver 340. The received signal y is input to the turbo decoder 140 for turbo decoding. The log-likelihood ratios (LLRs) $\Lambda_{in}$ of the received signal y consist of LLRs of the systematic bits μ, the first parity bits p and the second parity bits. Namely, we have $\Lambda_{in} = \{\Lambda_\mu, \Lambda_p, \Lambda_q\}$, where notation $\Lambda_\mu$ denotes the LLRs of the systematic bits μ, notation $\Lambda_p$ denotes the LLRs of the first parity bits p, notation $\Lambda_q$ denotes the LLRs of the second parity bits q, and notation $\Lambda_{in}$ can be expressed by $$\Lambda_{in} = \log \frac{P(y_i \mid x_i = +1)}{P(y_i \mid x_i = -1)} = \frac{2}{\sigma^2} y_i.$$

The first decoder 310 receives $\Lambda_\mu$, $\Lambda_p$ and a first prior information $\text{Prior}_1^{(i)}$, and accordingly produces a first extrinsic information $E_1^{(i)}$, for i denotes i-th iteration and $\text{Prior}_1^{(0)}$ is initially set to zero. The interleaver 320 produces a second prior information $\text{Prior}_2^{(i)}$ based on the first extrinsic information $E_1^{(i)}$ and produces interleaved systematic bits $\mu^\pi$ having LLRs $\Lambda_\mu^\pi$ based on the systematic bits.

The second decoder 330 receives $\Lambda_\mu^\pi$, $\Lambda_q$ and the second prior information $\text{Prior}_2^{(i)}$ to thereby produce a second extrinsic information $E_2^{(i)}$. The second extrinsic information $E_2^{(i)}$ is passed through the deinterleaver 340 to thereby produce the first prior information $\text{Prior}_1^{(i)}$.

After a certain amount of iterations, the iteration can be stopped after the second decoder 330 ends the decoding, and the second decoder 330 outputs a second LLR $\Lambda_{out,2}^{(i)} = \Lambda_\mu + E_1^{(i)} + \text{Prior}_1^{(i)}$.

In addition, the iteration can be stopped after the first decoder 310 ends the decoding, and the first decoder 310 outputs a first $\Lambda_{out,1}^{(i)} = \Lambda_\mu + E_1^{(i)} + \text{Prior}_1^{(i-1)}$.

In wireless communication systems, a signal power can be adjusted by a power control mechanism, and each code block has a different channel noise power. The Log-MAX decoding procedure depends on the channel characteristics for optimization, which involves a non-linear operation expressed by $\log(e^x + e^y) = \max(x,y) + \log(1 + e^{-|x-y|})$.

The Max-Log-MAP decoding procedure is a simplified version of the Log-MAX decoding procedure, which eliminates the nonlinear item $\log(1 + e^{-|x-y|})$. Therefore, in the Max-Log-MAP decoding procedure, the LLRs can be set directly to values to be received, i.e., $\Lambda_{in} = y_i$, without performing a channel estimation, but the performance is reduced by about 0.5 dB than the Log-MAX decoding procedure. When the channel estimation is not accurate, the Log-MAX decoding performance is reduced significantly in comparison with the Max-Log-MAP decoding performance.

In U.S. Pat. No. 6,393,257 granted to Holtzman for a "Wireless communications receiver and decoder for receiving encoded transmissions, such as transmissions using turbo codes, and estimating channel conditions", channel estimation is achieved by computing the ensemble average E[|y|] of first-order absolute values of a received signal y and the ensemble average of the square received signal y $E[y^2]$. However, computing $y^2$ consumes much computational capability. For example, if the received signal y has K message bits, the square $E[y^2]$ for the received signal y can be expressed by:

$$E[y^2] = \frac{(y_0)^2 + (y_1)^2 + \ldots + (y_{K-1})^2}{K}.$$

From this equation, it is known that $y_i^2$ is computed K times for finding $E[y^2]$, which is impractical.

In addition, an improved channel estimation method is proposed in the article "Effect of Mismatched SNR on the Performance of Log-MAP Turbo Decoder," IEEE Trans. on Vehicular Technology, vol. 52, Issue 5, September 2003, which firstly performs the Max-Log-MAP decoding one time, then uses the hard decision based on a temporary LRR to estimate the channel signal-to-noise ration (SNR), and finally performs the Log-MAX decoding. In this case, since the Max-Log-MAP decoding is performed only one time, computing the square E[y²] for the received signal y is required in the Log-MAX decoding.

Therefore, it is desirable to provide an improved turbo decoding method system to mitigate and/or obviate the aforementioned problems.

SUMMARY OF THE INVENTION

An object of the present invention is to provide a decoding method and system for real-time wireless channel estimation, which can understand the channel condition ($\hat{A}$, $\hat{\sigma}$) when perform a Log-MAP decoding procedure is performed and therefore avoid the problems of incorrect channel estimation and low Log-MAX decoding performance.

In accordance with one aspect of the invention, there is provided a decoding method for real-time wireless channel estimation, which decodes a received signal with a noise. The received signal is coded by a concatenation code. The method includes the steps: (A) receiving the received signal with K message bits transmitted between a base station and corresponding stations; (B) applying a Max-Log-MAP decoding procedure to perform a certain amount of decoding on the received signal; (C) using temporary log-likelihood ratios (LLRs) to compute hard decisions of the K message bits of the received signal; (D) computing an ensemble average of the K message bits based on the hard decisions and the K message bits, and assigning the ensemble average to an estimated amplitude of the received signal; (E) computing an ensemble average of a first momentum based on absolute values of the K message bits; and (F) computing a ratio based on the ensemble average of the first momentum and the estimated amplitude of the received signal, and computing an estimated variance of the noise based on the ratio.

In accordance with another aspect of the invention, there is provided a decoding system for real-time wireless channel estimation, which decodes a received signal with a noise. The received signal is coded by a concatenation code and contains K message bits. The K message bits are grouped into systematic bits, first parity bits and second parity bits. The system includes a first decoder, an interleaver, a second decoder, a deinterleaver, a channel estimator and a controller. The first decoder receives a systematic bit log-likelihood ratio (LLR), a first parity bit LLR and a first prior information, and accordingly performs a Max-Log-MAP or Log-MAP decoding for producing a first extrinsic information and a first output LLR. The interleaver is connected to the first decoder in order to receive the systematic bit LLR and the first extrinsic information for re-arrangement to thereby produce an interleaved systematic bit LLR and a second prior information. The second decoder is connected to the interleaver in order to receive the interleaved systematic bit LLR, a second parity bit LLR and the second prior information, and accordingly performs the Max-Log-MAP or Log-MAP decoding for producing a second extrinsic information and a second output LLR. The deinterleaver is connected to the second decoder in order to receive the second extrinsic information for re-arrangement to thereby produce the first prior information. The channel estimator is connected to the first and the second decoders in order to perform a channel estimation in accordance with the received signal, the first output LLR and the second output LLR to thereby produce an estimated amplitude of the received signal and an estimated variance to the first decode and the second decoder. The controller is connected to the channel estimator, the first decoder and the second decoder in order to control the first and the second decoders to first perform a certain amount of decoding on the received signal by a Max-Log-MAP decoding procedure and then by a Log-MAP decoding procedure. The first decoder and the second decoder adjust the received signal in accordance with the estimated amplitude and variance when the Log-MAP decoding procedure is performed, and therefore produce an adjusted received signal.

The decoding system further includes a memory connected to the controller and storing a specific table. The controller is based on a code rate of the concatenation code and the K value to look up the specific table and thereby obtain the certain amount.

In addition, the first decoder and the second decoder adjust the first second extrinsic information and the second extrinsic information in accordance with the estimated amplitude and variance when the Log-MAP decoding procedure is performed, and therefore produce a scaled first extrinsic information and a scaled second extrinsic information respectively.

The adjusted received signal is obtained by dividing the received signal by $$\frac{\hat{A}\sigma^2}{2},$$

where $\sigma^2$ indicates the estimated variance and $\hat{A}$ indicates the estimated amplitude of the received signal.

The scaled first extrinsic information is obtained by dividing the first extrinsic information by $$\frac{\hat{A}\sigma^2}{2},$$

where $\sigma^2$ indicates the estimated variance and $\hat{A}$ indicates the estimated amplitude of the received signal.

The scaled second extrinsic information is obtained by dividing the second extrinsic information by $$\frac{\hat{A}\sigma^2}{2},$$

where $\sigma^2$ indicates the estimated variance and $\hat{A}$ indicates the estimated amplitude of the received signal.

The first decoder is a soft-on-soft-out decoder.
The second decoder is a soft-on-soft-out decoder.
The concatenation code is a turbo code.

Other objects, advantages, and novel features of the invention will become more apparent from the following detailed description when taken in conjunction with the accompanying drawings.

BRIEF DESCRIPTION OF THE DRAWINGS

FIGS. 7-1 and 7-2 show tables of computed and simulated results of an estimated amplitude in accordance with the invention;

DETAILED DESCRIPTION OF THE PREFERRED EMBODIMENT

Figure 4:
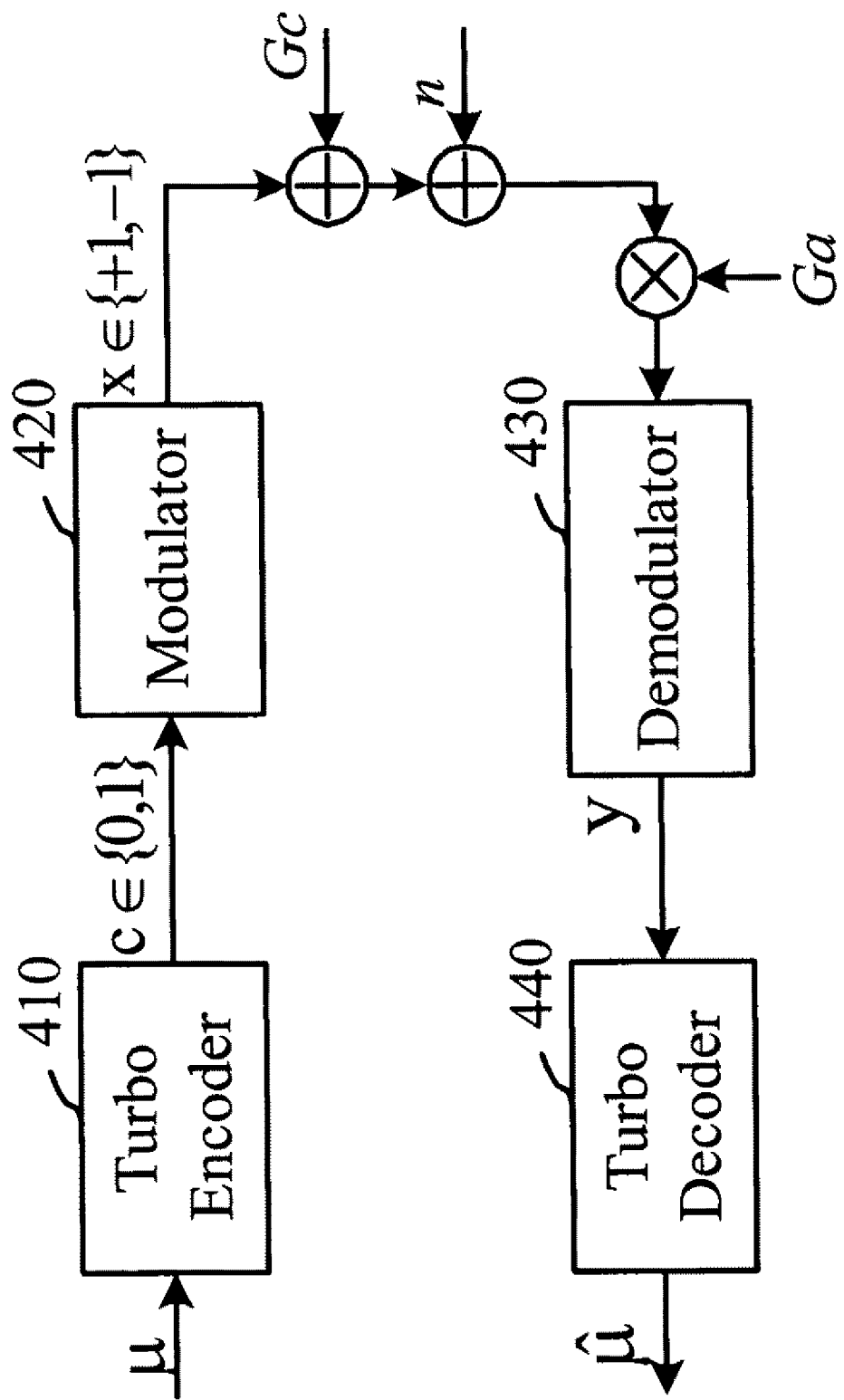
FIG. 4 is a schematic diagram of a wireless transmission system in accordance with the invention.

FIG. 4 is a schematic diagram of a wireless transmission system in accordance with the invention. In FIG. 4, the wireless transmission system includes a turbo encoder 410, a modulator 420, a demodulator 430 and a turbo decoder 440, in which Gc indicates a wireless channel gains, n indicates an additive white Gaussian noise (AWGN) existed in the wireless channel, Ga indicates a system gain in a receiving system before the turbo decoder, and y indicates a receiving signal. The gain Gc is a constant in a code block and independent to each other in different code blocks. The AWGN noise n is Gaussian distribution with zero mean and variance $\sigma_c^2$. The received signal y can be expressed by the following equation:

$$y_i = G_a G_c \sqrt{E_s} x_i + G_a n = A x_i + n',$$

where the amplitude $A = G_a G_c \sqrt{E_s}$, and the AWGN noise n' is Gaussian distribution with zero mean and equivalent variance $\sigma^2$, where $\sigma^2 = G_a^2 G_c^2$. Therefore, the effective SNR is given by:

$$SNR_r = \frac{G_c^2 E_s}{\sigma_c^2},$$

and an effective noise variance $\sigma^2$ is defined by:

$$\sigma^2 \equiv \frac{1}{SNR_r} = \frac{\sigma_c^2}{G_c^2 E_s}. \quad (1)$$

Further, an input log-likelihood ratio (LLR) can be expressed by the following equation:

$$\Lambda_{in,i} = \log \frac{P(y_i | x_i = +1)}{P(y_i | x_i = -1)} = \frac{2 G_c \sqrt{E_s}}{G_a \sigma_c^2} r_i = \frac{2A}{\sigma^2} r_i.$$

Figure 5:
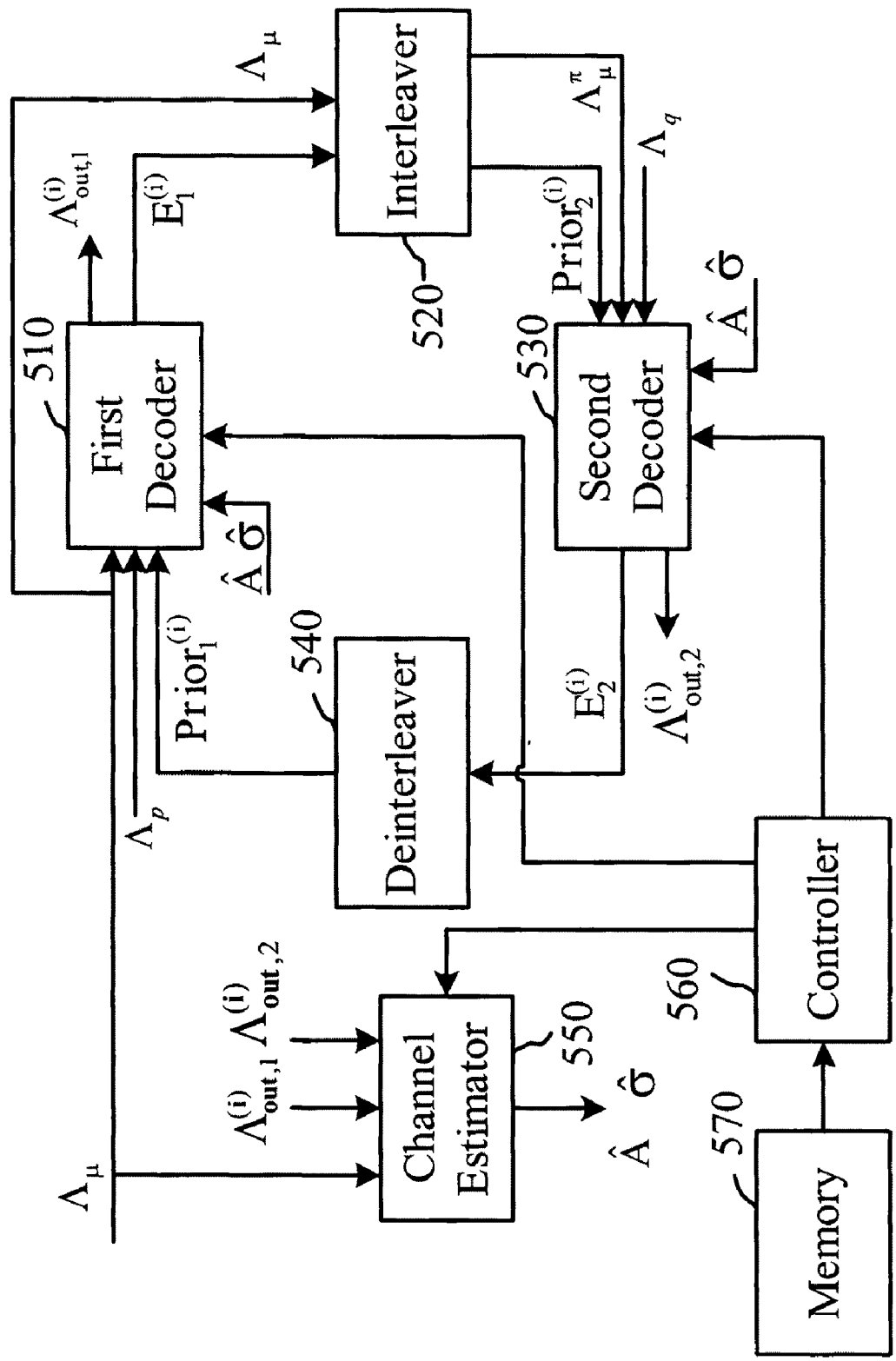
FIG. 5 is a block diagram of a decoding system for realtime wireless channel estimation in accordance with the invention.

FIG. 5 is a block diagram of a decoding system 440 for real-time wireless channel estimation in accordance with the invention. The decoding system 440 decodes a received signal with a noise. The received signal y is coded by a concatenation code and has K message bits. The K message bits are grouped into systematic bits $\mu$, first parity bits p and second parity bits q. The concatenation code is a turbo code. The LLRs $\Lambda_{in}$ of the received signal y includes the LLRs of the system bits $\mu$, first parity bits p and second parity bits q. Namely, we have $\Lambda_{in} = \{\Lambda_\mu, \Lambda_p, \Lambda_q\}$, where $\Lambda_\mu$ denotes the LLRs of the systematic bits $\mu$, $\Lambda_p$ denotes the LLRs of the first parity bits p, and $\Lambda_q$ denotes the LLRs of the second parity bits q.

The system 440 includes a first decoder 510, an interleaver 520, a second decoder 530, a deinterleaver 540, a channel estimator 550, a controller 560 and a memory 570.

At the beginning of the decoding, the system 440 initializes an index to be 1 and the $\text{Prior}_1^{(i)}$ to be 0, and sets s as a predetermined number of decoding.

The first decoder 510 is a soft-input-soft-output (SISO) decoder to receive a systematic bit log-likelihood ratio (LLR) $\Lambda_\mu$, a first parity bit LLR $\Lambda_p$ and a first prior information $\text{Prior}_1^{(i)}$, and accordingly performs a Max-Log-MAP decoding. If the Max-Log-MAP decoding is performed, the first decoder 510 produces a first extrinsic information $E_1^{(1)}$ and a first output LLR $\Lambda_{out,1}^{(1)}$.

The interleaver 520 is connected to the first decoder 510 in order to receive the first extrinsic information ($E_1^{(1)}$) and the systematic bit LLR $\Lambda_\mu$ for re-arrangement to thereby produce a second prior information $\text{Prior}_2^{(1)}$ and an interleaved systematic bit LLR $\Lambda_\mu^\pi$.

The second decoder 530 is a soft-input-soft-output decoder connected to the interleaver 520 in order to receive the interleaved systematic bit LLR $\Lambda_\mu^\pi$, a second parity bit LLR $\Lambda_q$ and the second prior information $\text{Prior}_2^{(1)}$, and accordingly performs the Max-Log-MAP decoding. If the Max-Log-MAP decoding is performed, the second decoder 530 produces a second extrinsic information $E_2^{(1)}$ and a second output LLR $\Lambda_{out,2}^{(1)}$.

The deinterleaver 540 is connected to the second decoder 530 in order to receive the second extrinsic information ($E_2^{(1)}$) for re-arrangement to thereby produce the first prior information $\text{Prior}_1^{(2)}$. At this moment, the system 440 completes the first iteration of decoding and increases the index i with 1 to perform the second iteration of decoding.

The first stage decoding is performed with s iterations of iterative decoding. When the index i is increased to be equal to the predetermined decoding number s, the system 440 temporarily suspends the decoding and sends the LLRs ($\Lambda_{out,1}^{(s)}$, and $\Lambda_{out,2}^{(s)}$) to the channel estimator 550 for channel estimation (Â and $\tilde{\sigma}$).

The channel estimator 550 is connected to the first and the second decoders 510 and 530 in order to perform a channel estimation in accordance with the received signal, the first output LLR and the second output LLR to thereby produce estimated amplitude Â and variance $\tilde{\sigma}$ of the received signal that are subsequently output to the first decode 510 and the second decoder 530.

The controller 560 is connected to the channel estimator 550, the first decoder 510 and the second decoder 530 in order to control the first and the second decoders 510 and 530 to perform a certain amount of decoding on the received signal by a Max-Log-MAP decoding procedure. Accordingly, the first extrinsic information and the first output LLR produced by the first decoder 510 are denoted by $E_1^{(s)}$ and $\Lambda_{out,1}^{(s)}$ respectively. The second extrinsic information and the second output LLR produced by the second decoder 530 are denoted by $E_2^{(s)}$ and $\Lambda_{out,2}^{(s)}$ respectively.

The controller 560 then controls the first decoder 510 and the second decoder 530 to use a Log-MAP decoding procedure in decoding. In this case, the controller 560 is based on a message length and a code rate to predetermine when the decoding procedure is changed from the Max-Log-MAP decoding procedure to the Log-MAP decoding procedure. Accordingly, the first extrinsic information and the first output LLR produced by the first decoder 510 are denoted by $E_1^{(i)}$ and $\Lambda_{out,1}^{(i)}$ respectively. The second extrinsic information and the second output LLR produced by the second decoder 530 are denoted by $E_2^{(i)}$ and $\Lambda_{out,2}^{(i)}$ respectively.

The memory 570 connected to the controller 560 stores a specific table. The controller 560 is based on the code rate of the concatenation code and the K value to look up the table and obtain the certain amount.

When the first decoder 510 and the second decoder 530 perform the Max-Log-MAP decoding procedure, there is no need to adjust the received signal in accordance with the estimated amplitude and variance A and a because of no need to understand the channel conditions. When the first decoder 510 and the second decoder 530 perform the Log-MAP decoding procedure, there is a need to adjust the received signal in accordance with the estimated amplitude and variance $\hat{A}$ and $\hat{\sigma}$ because understanding the channel conditions is necessary, thereby producing an adjusted received signal. When the first decoder 510 and the second decoder 530 depends on the adjusted received signal to perform the Log-MAP decoding procedure, the first extrinsic information $E_1^{(t)}$ produced by the first decoder 510 and the second extrinsic information $E_2^{(t)}$ produced by the second decoder 530 are also adjusted in accordance with the estimated amplitude and variance $\hat{A}$ and $\hat{\sigma}$ to further produce a scaled first extrinsic information and a scaled second extrinsic information.

Figure 6:
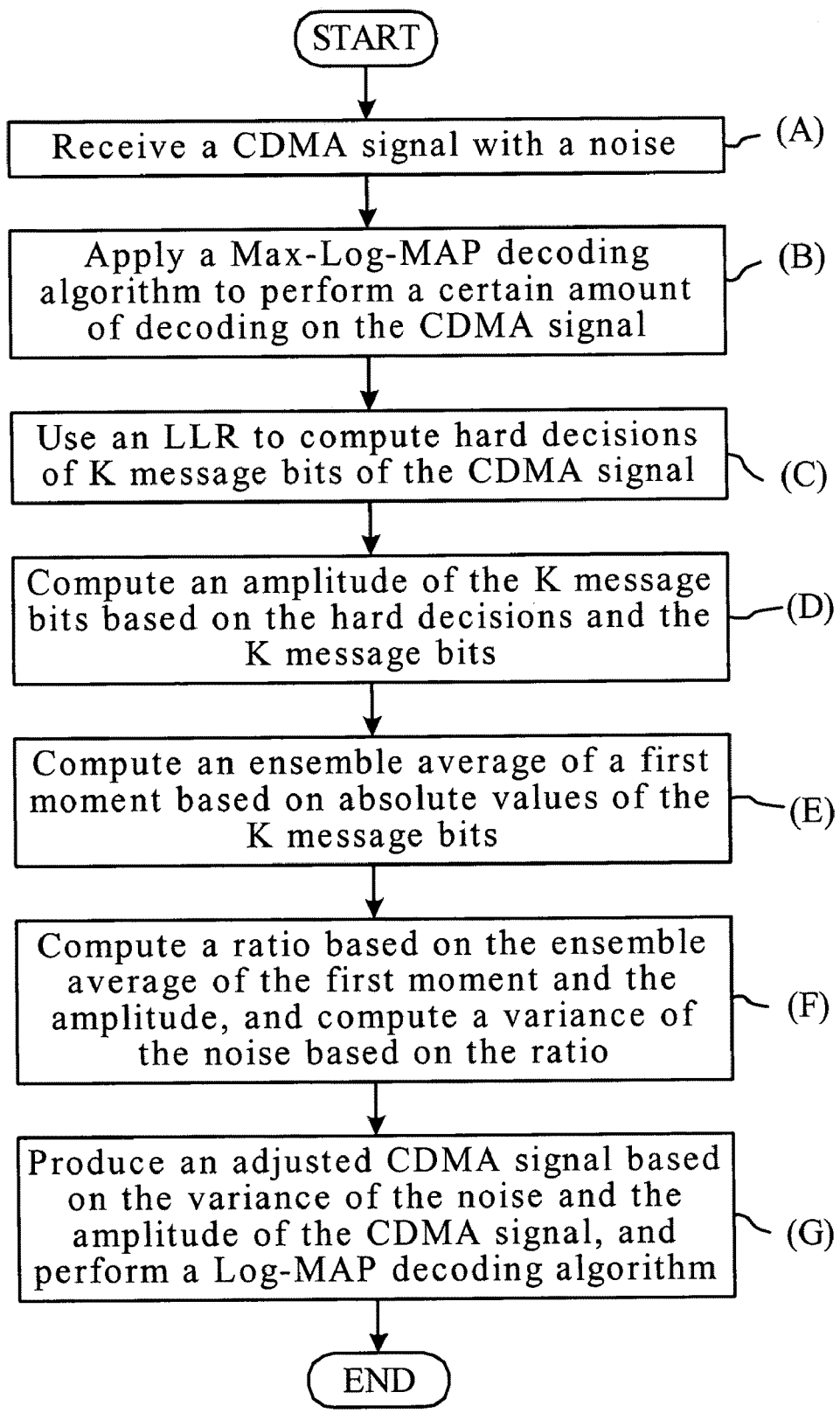
FIG. 6 is a flowchart of a decoding method for realtime wireless channel estimation in accordance with the invention.

FIG. 6 is a flowchart of a decoding method for real-time wireless channel estimation in accordance with the invention. The decoding method decodes a code division multiple access (CDMA) signal with a noise. The received signal is coded by a concatenation code. The concatenation code is a turbo code. Step (A) receives the received signal y with K message bits.

Step (B) performs a certain amount of decoding on the received signal y by the Max-Log-MAP decoding procedure. The certain amount is obtained by looking up a specific table based on the code rate of the concatenation code and the K value.

Step (C) uses the temporary LLR of each message bit of the received signal to compute the hard decision of each message bit of the received signal. Since step (B) performs the certain amount of Max-Log-MAP decoding procedure, the temporary LLR of i-th message bit is denoted by $\Lambda_i^{(s)}$. The hard decision $\hat{u}_i^{(s)}$ of the i-th message bit in step (C) can be expressed by $\hat{u}_i^{(s)}=0$, if $\Lambda_i^{(s)} \geqq 0$; and $\hat{u}_i^{(s)}=1$, if $\Lambda_i^{(s)} < 0$, where $\Lambda_i^{(s)}$ indicates the temporary LLR.

Step (D) depends on the K message bits and the hard decision $\hat{u}_i^{(s)}$ of each message bit to compute an ensemble average of the K message bits. The ensemble average of the K message bits is regarded as an estimated amplitude $\hat{A}$ of the received signal. In this case, the estimated amplitude $\hat{A}$ of the received signal in step (D) is expressed by:

$$\hat{A} = \frac{\sum_i^K (-1)^{\hat{u}_i^{(s)}} \times y_{u,i}}{K}, \quad (2)$$

where $\hat{u}_i^{(s)}$ indicates a hard decision of i-th message bit, and $y_{u,i}$ indicates the i-th message bit.

In this embodiment, the entire K message bits are used in step (D). However, in other embodiments, the partial message bits can be used in step (D). For example, the partial message bits $$\frac{K}{2}, \frac{K}{3}, 100, \dots$$

are used to compute the estimated amplitude $\hat{A}$. The partial message bits can be any message bits or highest reliable values selected from the K message bits. Namely, if the partial message bits are used in step (D), the estimated amplitude $\hat{A}$ of the received signal is expressed by:

$$\hat{A} = \frac{\sum_i^K (-1)^{\hat{u}_i^{(s)}} \times y_{u,i}}{K'}, \quad (2')$$

where K' can be $$\frac{K}{2}, \frac{K}{3}, \dots.$$

In step (E), the ensemble average of a first momentum is computed in accordance with an absolute of the K message bits. The ensemble average W of the first momentum is expressed by:

$$W = \frac{\sum_i^K |y_{u,i}|}{K}, \quad (3)$$

where $|y_{u,i}|$ is an absolute of i-th message bit. If the partial message bits are used in step (D), the ensemble average W of the first momentum is expressed by $$W = \frac{\sum_i^K |y_{u,i}|}{K'}, \quad (3')$$

Step (F) depends on the ensemble average W of the first momentum and the estimated amplitude $\hat{A}$ of the received signal to compute a ratio a, and computes the estimated variance $\hat{\sigma}$ of the noise in accordance with the ratio a. The ratio a in step (F) is expressed by:

$$a = \frac{W}{\hat{A}},$$

where W indicates the ensemble of the first momentum, and $\hat{A}$ indicates the estimated amplitude of the received signal. The estimated variance $\hat{\sigma}$ is computed by a polynomial, for example, $$\hat{\sigma}^2 = -1.8833 \times a^2 + 8.6671 \times a - 6.5398, \quad (4)$$

where a is the ratio. In this embodiment, a second-order polynomial is used. However, in other embodiments, a polynomial of different order or a polynomial with coefficients approximated to those in equation (4) can be used.

When the estimated variance $\hat{\sigma}$ of the noise is obtained in step (F), the channel quality is determined accordingly. Namely, the invention can be applied in a wireless channel estimation. Therefore, the invention has a considerably reduced computational complexity in comparison with the U.S. Pat. No. 6,393,257.

Step (G) depends on the estimated variance $\hat{\sigma}$ of the noise and the estimated amplitude $\hat{A}$ of the received signal to adjust the received signal to thereby obtain an adjusted received signal y'. Subsequently, the Log-MAP decoding procedure is used to decode the adjusted received signal.

In step (G), the adjusted received signal is obtained by dividing the received signal or the last adjusted received signal y' by $$\frac{\hat{A}\sigma^2}{2},$$

where $\sigma^2$ indicates the variance, and $\hat{A}$ indicates the amplitude of the received signal.

Figure 1:
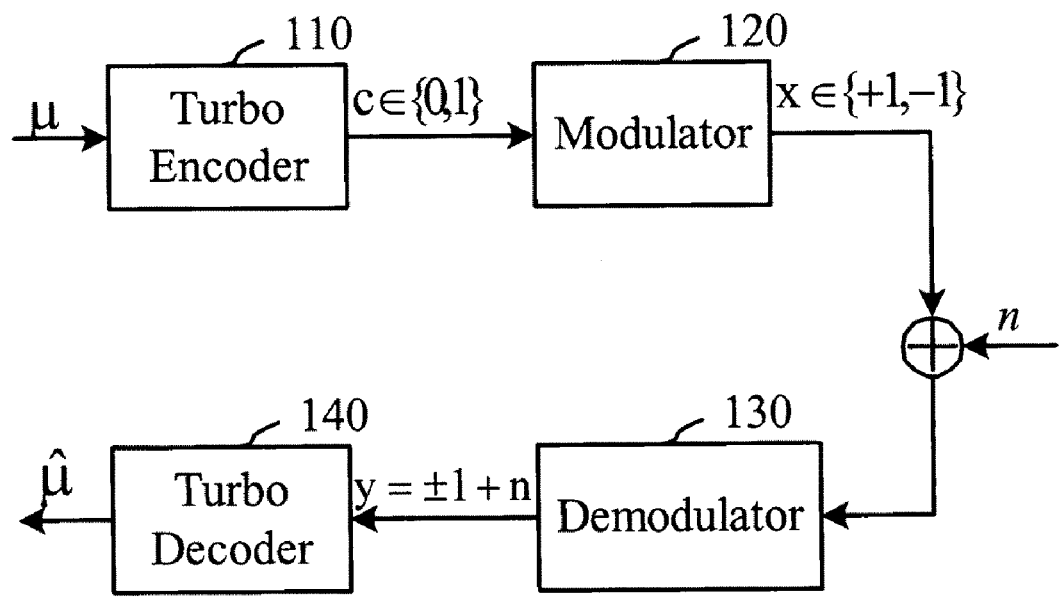
FIG. 1 is a diagram of a typical configuration of communication system using a turbo code based on the UMTS WCDMA standard.
Figure 2:
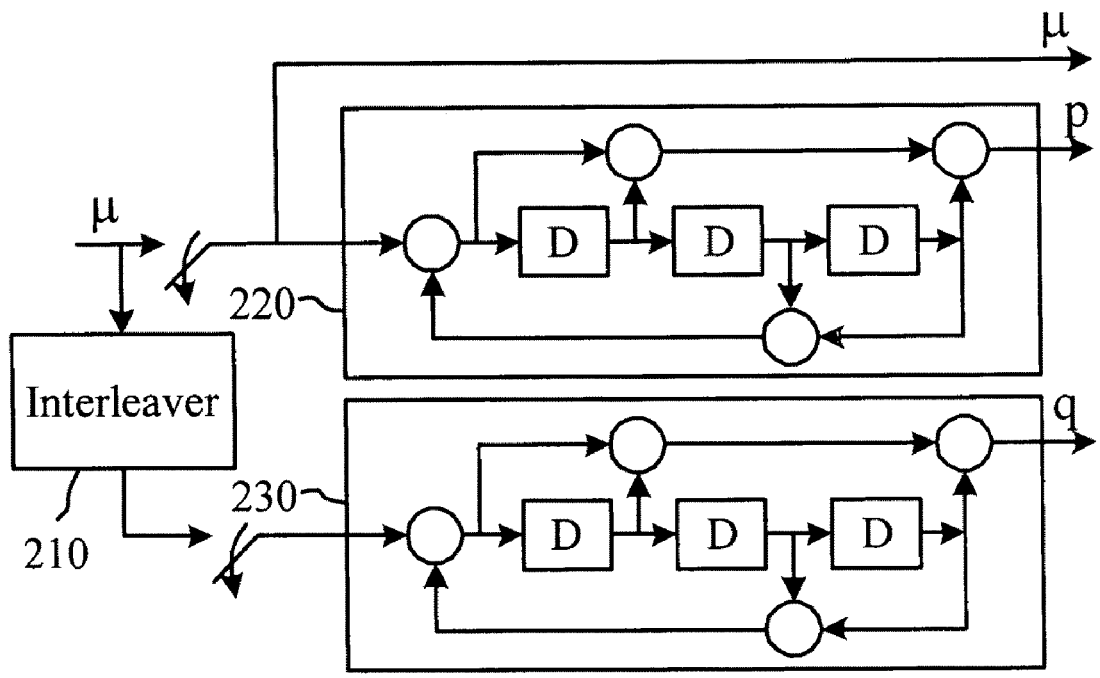
FIG. 2 is a block diagram of a typical turbo encoder.
Figure 3:
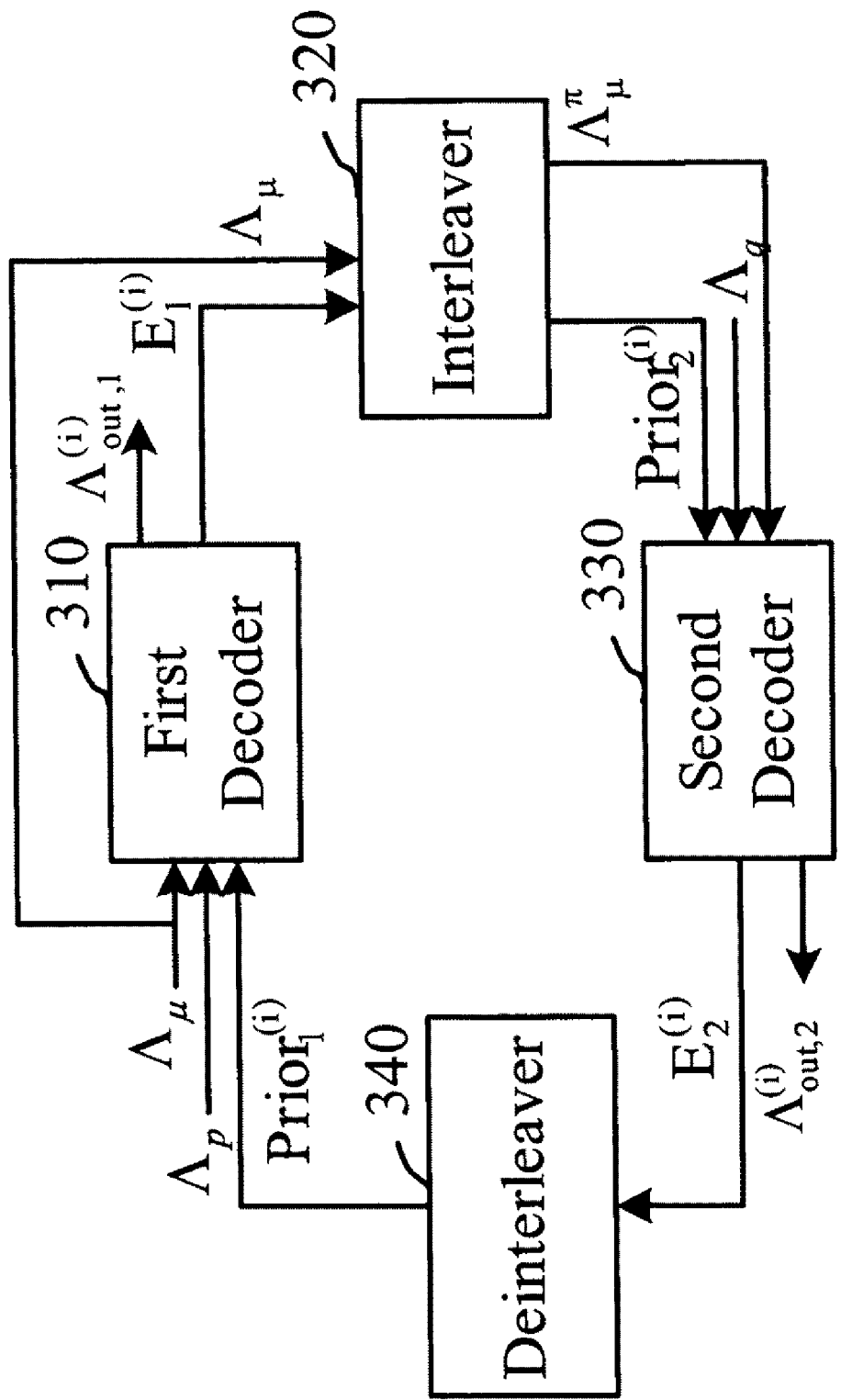
FIG. 3 is a block diagram of a typical turbo decoder.

FIGS. 7-1 and 7-2 show tables of computed and simulated results of the estimated amplitude $\hat{A}$ in accordance with the invention. The values of weighted extrinsic field and weighted LLR field in FIGS. 7-1 and 7-2 are obtained by the Monte Carlo simulation. As shown in FIGS. 7-1 and 7-2, the simulated results of the estimated amplitude $\hat{A}$ are very close to a true value A=1. In addition, the ones that are selected from the simulated results and have the highest accuracy can be regarded as the certain amount at different conditions.

Figure 8:
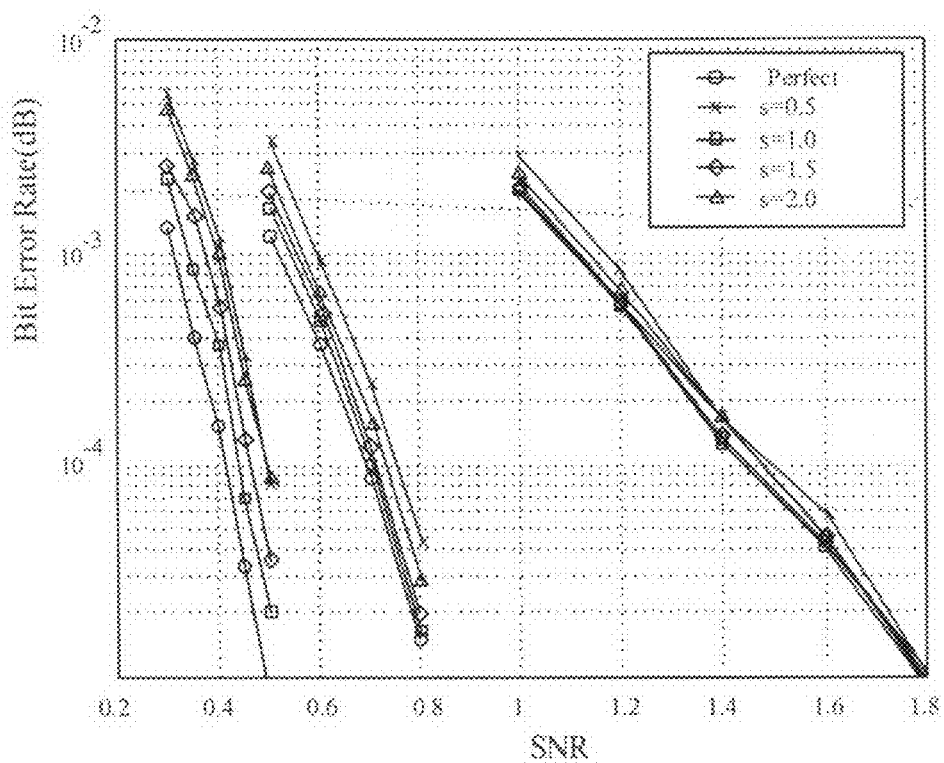
FIG. 8 is a schematic graph of a result of bit error rate (BER) and signal-to-noise ratio (SNR) comparison in accordance with the invention.

FIG. 8 is a schematic graph of a bit error rate (BER) and signal-to-noise ratio (SNR) comparison in accordance with the invention. As shown in FIG. 8, the simulated results are obtained under the gains Gc and Ga to have a change range from −6 dB to +6 dB for rate ⅓ turbo codes with K=300, 1600, 5000 respectively, and the certain amount s=0.5, 1.0, 1.5, 2.0 respectively.

Figure 9:
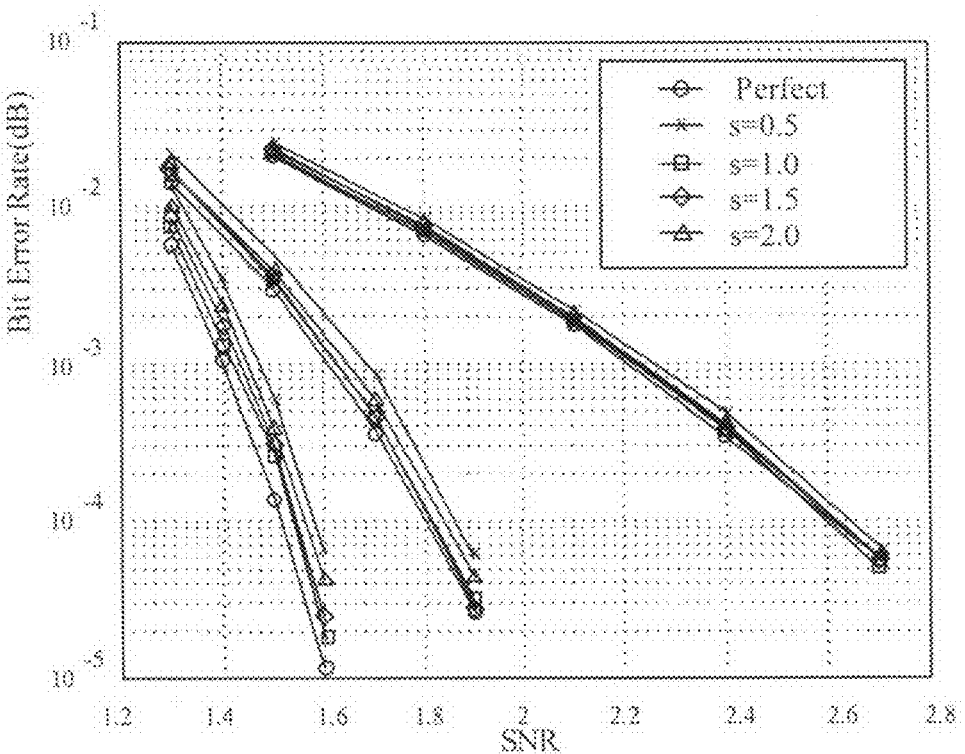
FIG. 9 is a schematic graph of another result of bit error rate (BER) and signal-to-noise ratio (SNR) comparison data in accordance with the invention.

FIG. 9 is a schematic graph of another result of bit error rate (BER) and signal-to-noise ratio (SNR) comparison data in accordance with the invention. In this case, the simulated results are obtained under the gains Gc and Ga to have a change range from −6 dB to +6 dB for rate ⅗ turbo codes with K=300, 1600, 5000 respectively, and the certain amount s=0.5, 1.0, 1.5, 2.0 respectively.

As shown in FIGS. 8 and 9, it is known that the certain amount s=1.0 is the best choice for code rates ⅓ and ⅗ and K=1600 and 5000 respectively. In addition, the performance is reduced to a value below 0.1 dB at different certain amount s, which is caused by the difference between the Max-Log-MAP decoding procedure and the Log-MAP decoding procedure, but not by the accuracy of the estimated amplitude $\hat{A}$ in the invention.

In view of forgoing, it is known that, in the invention, when the first and second decoders 510 and 530 perform the Log-MAP decoding procedure, the channel conditions $\hat{A}$ and $\hat{\sigma}$ are known, and accordingly it is able to avoid that the Log-MAX decoding has a poor performance in comparison with the Max-Log-MAX decoding when the inaccurate channel estimation occurs.

Although the present invention has been explained in relation to its preferred embodiment, it is to be understood that many other possible modifications and variations can be made without departing from the spirit and scope of the invention as hereinafter claimed.

What is claimed is:

1. A decoding method for real-time wireless channel estimation, which decodes a received signal with a noise, the received signal being coded by a turbo code, the method comprising the steps:

(A) receiving the received signal with K message bits transmitted between a base station and corresponding stations;

(B) applying a Max-Log-MAP decoding procedure to perform a predetermined amount of decoding on the received signal, wherein the predetermined amount is obtained by looking up a table in accordance with a code rate of concatenation code and a value of K;

(C) using temporary log-likelihood ratios (LLRs) to compute hard decisions of the K message bits of the received signal, wherein the hard decision of i-th message bit in step (C) is computed by:

$\hat{u}_i^{(s)}=0$, if $\Lambda_i^{(s)} \geq 0$; and $\hat{u}_i^{(s)}=1$, if $\Lambda_i^{(s)}=0$, where $\Lambda_i^{(s)}$ denotes the temporary LLR of the i-th message bit;

(D) computing an ensemble average of the K message bits based on the hard decisions and the K message bits, and accordingly assigning the ensemble average to an estimated amplitude of the received signal;

(E) computing an ensemble average of a first momentum based on absolute values of the K message bits; and (F) computing a ratio based on the ensemble average of the first momentum and the estimated amplitude of the received signal, and computing an estimated variance of the noise based on the ratio; and (G) adjusting the received signal in accordance with the estimated amplitude of the received signal and the estimated variance of the noise to thereby produce an adjusted received signal, and decoding the adjusted received signal by a Log-Map decoding procedure.

2. The method as claimed in claim 1, wherein the estimated amplitude $\hat{A}$ in step (D) is expressed by:

$$\hat{A} = \frac{\sum_i^K (-1)^{\hat{u}_i^{(s)}} \times y_{u,i}}{K},$$

where $\hat{u}_i^{(s)}$ indicates the temporary LLR of the i-th message bit, $y_{u,i}$ indicates the i-th message bit, and K is a multiple of K'.

3. The method as claimed in claim 2, wherein the ensemble average W of the first momentum step (E) is expressed by:

$$W = \frac{\sum_i^K |y_{u,i}|}{K},$$

where $|y_{u,i}|$ is an absolute value of the i-th message bit.

4. The method as claimed in claim 1, wherein the estimated amplitude $\hat{A}$ in step (D) is expressed by $$\hat{A} = \frac{\sum_i^K (-1)^{\hat{u}_i^{(s)}} \times y_{u,i}}{K'},$$

where $\hat{u}_i^{(s)}$ indicates the hard decision of the i-th message bit, and $y_{u,i}$ indicates the i-th message bit.

5. The method as claimed in claim 4, wherein the ensemble average W of the first momentum in step (E) is expressed by:

$$W = \frac{\sum_{i}^{K} |y_{u,i}|}{K'},$$

where $|y_{u,i}|$ is an absolute value of the i-th message bit.

6. The method as claimed in claim 5, wherein the ratio a in step (F) is expressed by $$a = \frac{W}{\hat{A}},$$

where W indicates the ensemble average of the first momentum, and $\hat{A}$ indicates the estimated amplitude of the received signal.

7. The method as claimed in claim 6, wherein the estimated variance $\sigma^2$ in step (F) is determined based on a polynomial of the ratio a.

8. The method as claimed in claim 7, wherein the estimated variance $\sigma^2$ in step (F) is computed as follows:

$$\sigma^2 = -1.8833 \times a^2 + 8.6671 \times a - 6.5398.$$

9. The method as claimed in claim 8, wherein the adjusted received signal in step (G) is obtained by dividing the received signal by $$\frac{\hat{A}\sigma^2}{2},$$

where $\sigma^2$ indicates the estimated variance of the noise and $\hat{A}$ indicates the estimated amplitude of the received signal.

10. A decoding system for real-time wireless channel estimation, which decodes a received signal with a noise, the received signal being coded by a concatenation code and containing K message bits, the K message bits being grouped into systematic bits, first parity bits and second parity bits, the system comprising:
   a first decoder, which receives a systematic bit log-likelihood ratio (LLR), a first parity bit LLR and a first prior information and accordingly produces a first extrinsic information and a first output LLR by selectively performing a Max-Log-MAP decoding or a Log-MAP decoding;
   an interleaver, which is connected to the first decoder, in order to receive the systematic bit LLR and the first extrinsic information for re-arrangement to thereby produce a second prior information and an interleaved systematic bit LLR;
   a second decoder, which is connected to the interleaver, in order to receive the interleaved systematic bit LLR, a second parity bit LLR and the second prior information and selectively performs the Max-Log-MAP decoding or the Log-MAP decoding for producing a second extrinsic information and a second output LLR;
   a deinterleaver, which is connected to the second decoder, in order to receive the second extrinsic information for re-arrangement to thereby produce the first prior information;
   a channel estimator, which is connected to the first decoder and the second decoder, in order to perform a channel estimation in accordance with the received signal, the first output LLR and the second output LLR to thereby produce an estimated amplitude of the received signal and an estimated variance to the first decoder and the second decoder; and
   a controller, which is connected to the channel estimator, the first decoder and the second decoder in order to control the first decoder and the second decoder to first perform a predetermined amount of decoding on the received signal by a Max-Log-MAP decoding procedure, and then control the first decoder and the second decoder to perform a decoding on the received signal by a Log-MAP decoding procedure;
   wherein the first decoder and the second decoder adjust the received signal in accordance with the estimated amplitude and the estimated variance when the Log-MAP decoding procedure is performed, and therefore produce an adjusted received signal.

11. The system as claimed in claim 10, further comprising a memory, which is connected to the controller, in order to store a specific table such that the controller depends on a code rate of the concatenation code and a value of K to look up the specific table and thereby obtain the predetermined amount.

12. The system as claimed in claim 10, wherein the adjusted received signal is obtained by dividing the received signal by $$\frac{\hat{A}\sigma^2}{2},$$

where $\sigma^2$ indicates the estimated variance and $\hat{A}$ indicates the estimated amplitude.

13. The system as claimed in claim 10, wherein the first decoder and the second decoder adjust the first extrinsic information and the second extrinsic information in accordance with the estimated amplitude and the estimated variance when the Log-MAP decoding procedure is performed, and therefore produce a scaled first extrinsic information and a scaled second extrinsic information respectively.

14. The system as claimed in claim 13, wherein the scaled first extrinsic information is obtained by dividing the first extrinsic information by $$\frac{\hat{A}\sigma^2}{2},$$

where $\sigma^2$ indicates the estimated variance and $\hat{A}$ indicates the estimated amplitude.

15. The system as claimed in claim 13, wherein the scaled second extrinsic information is obtained by dividing the second extrinsic information by $$\frac{\hat{A}\sigma^2}{2},$$

where $\sigma^2$ indicates the estimated variance and $\hat{A}$ indicates the estimated amplitude of the received signal.

16. The system as claimed in claim 10, wherein the first decoder is a soft-input-soft-out (SISO) decoder and the second decoder is a soft-input-soft-out decoder.

17. The system as claimed in claim 10, wherein the concatenation code is a turbo code.

* * * * *